(12) United States Patent
Arai

(10) Patent No.: US 12,029,124 B2
(45) Date of Patent: Jul. 2, 2024

(54) THERMOELECTRIC CONVERSION MODULE, INSULATED CIRCUIT SUBSTRATE, METHOD FOR BONDING MEMBERS, AND METHOD FOR ATTACHING A THERMOELECTRIC CONVERSION MODULE

(71) Applicant: MITSUBISHI MATERIALS CORPORATION, Tokyo (JP)

(72) Inventor: Koya Arai, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 46 days.

(21) Appl. No.: 17/798,435

(22) PCT Filed: Feb. 19, 2021

(86) PCT No.: PCT/JP2021/006451
§ 371 (c)(1),
(2) Date: Aug. 9, 2022

(87) PCT Pub. No.: WO2021/167089
PCT Pub. Date: Aug. 26, 2021

(65) Prior Publication Data
US 2023/0077233 A1 Mar. 9, 2023

(30) Foreign Application Priority Data
Feb. 19, 2020 (JP) .................................. 2020-026446

(51) Int. Cl.
*H10N 10/17* (2023.01)
*H10N 10/813* (2023.01)

(52) U.S. Cl.
CPC ........... *H10N 10/17* (2023.02); *H10N 10/813* (2023.02)

(58) Field of Classification Search
None
See application file for complete search history.

(56) References Cited

U.S. PATENT DOCUMENTS

2007/0095378 A1  5/2007 Ito et al.
2017/0365761 A1  12/2017 Lee et al.

FOREIGN PATENT DOCUMENTS

EP  1580819 A2 *  9/2005  ............. H01L 35/04
EP  3664277 A1  6/2020
(Continued)

OTHER PUBLICATIONS

International Search Report mailed May 18, 2021, issued for PCT/JP2021/006451 and English translation thereof.

*Primary Examiner* — Eli S Mekhlin
(74) *Attorney, Agent, or Firm* — Locke Lord LLP; James E. Armstrong, IV; Nicholas J. DiCeglie, Jr.

(57) ABSTRACT

A thermoelectric conversion module is formed by arranging, on one surface, a plurality of thermoelectric conversion element pairs in which an n-type thermoelectric conversion element and a p-type thermoelectric conversion element are connected by interposing an electrode plate, and connecting the plurality of the thermoelectric conversion element pairs in series; and the thermoelectric conversion module has a first output terminal provided on one thermoelectric conversion element pair arranged at one end side of the plurality of the thermoelectric conversion element pairs connected in series, a second output terminal provided on the other thermoelectric conversion element pair arranged at the other end side of the plurality of the thermoelectric conversion element pairs connected in series, and an intermediate output terminal provided at any position between the thermoelectric conversion element pair arranged at the one end (Continued)

side and the thermoelectric conversion element pair arranged at the other end side.

8 Claims, 5 Drawing Sheets

(56) References Cited

FOREIGN PATENT DOCUMENTS

| | | |
|---|---|---|
| JP | 2007-150231 A | 6/2007 |
| JP | 2008-091442 A | 4/2008 |
| JP | 2009-010138 A | 1/2009 |
| JP | 2010-516061 A | 5/2010 |
| JP | 2012-533972 A | 12/2012 |
| WO | 2008/086499 A2 | 7/2008 |
| WO | 2016/143620 A1 | 9/2016 |
| WO | 2019/026639 A1 | 2/2019 |

* cited by examiner

THERMOELECTRIC CONVERSION MODULE, INSULATED CIRCUIT SUBSTRATE, METHOD FOR BONDING MEMBERS, AND METHOD FOR ATTACHING A THERMOELECTRIC CONVERSION MODULE

TECHNICAL FIELD

The present invention relates to a thermoelectric conversion module formed by connecting a plurality of thermoelectric conversion elements in series, an insulated circuit substrate, a method for bonding members using the thermoelectric conversion module, and a method for attaching a thermoelectric conversion module.

Priority is claimed on Japanese Patent Application No. 2020-026446, filed Feb. 19, 2020, the content of which is incorporated herein by reference.

BACKGROUND ART

The thermoelectric conversion element is an electronic element that enables mutual conversion between heat and electricity by the Seebeck effect and the Peltier effect. The Seebeck effect is an effect by which thermal energy is converted into electric energy, and it is a phenomenon in which an electromotive force is generated when a temperature difference is generated between both ends of a thermoelectric conversion material. In recent years, thermoelectric power generation utilizing this effect has been actively developed (see, for example, Patent Document 1).

As the thermoelectric conversion module that is composed by electrically connecting a plurality of thermoelectric conversion elements, a uni-leg type thermoelectric conversion module in which thermoelectric conversion elements having the same semiconductor type are connected to each other and a π (pi) type thermoelectric conversion module in which semiconductor types are different from each other are generally known, that is, n-type thermoelectric conversion elements and p-type thermoelectric conversion elements are alternately connected.

Among them, the π (pi) type thermoelectric conversion module makes it possible to simplify the electrical connection configuration as compared with the uni-leg type thermoelectric conversion module and carry out thermoelectric conversion with high efficiency by p-n connection.

In a case of carrying out thermoelectric power generation by using such a thermoelectric conversion module, it is possible to obtain power depending on the temperature difference, for example, by closely attaching the thermoelectric conversion module between two members between which a temperature difference is present and carrying out thermoelectric conversion with the thermoelectric conversion module depending on the temperature difference between the member on the high temperature side and the member on the low temperature side.

CITATION LIST

Patent Document

[Patent Document 1]
Published Japanese Translation No. 2012-533972 of the PCT International Publication

SUMMARY OF INVENTION

Technical Problem

In a case of carrying out thermoelectric power generation by using a thermoelectric conversion module, a member on the high temperature side and a member on the low temperature side are provided to sandwich the thermoelectric conversion module. However, it is necessary that the entire contact surface between the thermoelectric conversion module and each of the members is in contact with a uniform contact force in order to efficiently transfer heat between the thermoelectric conversion module and each of the members.

The distribution of the contact force on the contact surface between the thermoelectric conversion module and each of the members can be detected in a case where the thermoelectric conversion module is electrically comparted into a plurality of compartments and measuring the voltage in each of the compartments.

However, in the thermoelectric conversion module in the related art, output terminals are merely formed at one end and the other end of a plurality of thermoelectric conversion elements connected in series in order to obtain the maximum voltage, and thus a local voltage cannot be detected. Further, although a heat flow sensor that measures a heat flow distribution by aligning a plurality of thermoelectric conversion elements and extracting a local voltage in every several compartments is known, such a heat flow sensor cannot be used in the thermoelectric power generation in which all the thermoelectric conversion elements are connected in series to obtain the maximum voltage.

The present invention has been made in consideration of the above-described circumstances, and an object thereof is to provide a thermoelectric conversion module capable of detecting the distribution of the internal heat flux and obtaining a maximum voltage, in which all thermoelectric conversion elements are connected in series, an insulated circuit substrate, a method for bonding members using the thermoelectric conversion module, and a method for attaching a thermoelectric conversion module.

Solution to Problem

In order to solve the above problems, a thermoelectric conversion module of the present invention is characterized by having:
  a thermoelectric conversion element pair in which an n-type thermoelectric conversion element and a p-type thermoelectric conversion element are connected by interposing an electrode plate,
  in which a plurality of thermoelectric conversion element pairs is arranged on one surface and electrically connected in series,
  a first output terminal is provided on the thermoelectric conversion element pair arranged at one end side of the plurality of the thermoelectric conversion element pairs electrically connected in series, and a second output terminal is provided on the thermoelectric conversion element pair arranged at the other end side of the plurality of the thermoelectric conversion element pairs electrically connected in series, and
  an intermediate output terminal is provided at any position between the thermoelectric conversion element pair arranged at the one end side and the thermoelectric conversion element pair arranged at the other end side.

According to such a thermoelectric conversion module, it is possible to selectively supply the power having the maximum voltage, which is obtained by connecting all the thermoelectric conversion element pairs in series, and the power having a voltage lower than the maximum voltage, which is generated by any number of thermoelectric conversion element pairs.

In addition, it is possible to detect the distribution and bias of the heat flux applied to the thermoelectric conversion module by measuring the voltage between the first output terminal and the intermediate output terminal and the voltage between the second output terminal and the intermediate output terminal and then comparing them.

Further, in the thermoelectric conversion module of the present invention, the intermediate output terminals may be provided at two or more positions different from each other between the thermoelectric conversion element pair arranged at the one end side and the thermoelectric conversion element pair arranged at the other end side.

Further, in the thermoelectric conversion module of the present invention, thermoelectric conversion element pair rows, which are formed by linearly arranging the plurality of the thermoelectric conversion element pairs along a first direction of the one surface, may be aligned in a plurality of rows along a second direction of the one surface and connected in a crank shape to form the intermediate output terminal at a connecting portion between the thermoelectric conversion element pair rows adjacent to each other.

Further, in the thermoelectric conversion module of the present invention, the plurality of the thermoelectric conversion element pairs may be arranged along a first direction and a second direction of the one surface to form a rectangle as a whole, the plurality of the thermoelectric conversion element pairs may be comparted into four regions each including one angular part of four corners of the rectangle to form a thermoelectric conversion element pair compartment body in which the thermoelectric conversion element pairs for each region are connected in series, and four thermoelectric conversion element pair compartment bodies may be connected in series to form the intermediate output terminal in the thermoelectric conversion element pair at a position where the thermoelectric conversion element pair compartment bodies are connected to each other.

In addition, the thermoelectric conversion module of the present invention may further have a first thermal conductive insulating layer in contact with the thermoelectric conversion element pair on the one surface; and a second thermal conductive insulating layer in contact with the thermoelectric conversion element pair on the other surface facing the one surface.

An insulated circuit substrate of the present invention is characterized by having: a thermoelectric conversion element pair in which an n-type thermoelectric conversion element and a p-type thermoelectric conversion element are connected by interposing an electrode plate; and a thermal conductive insulating layer, in which a plurality of the thermoelectric conversion element pairs is arranged on one surface of the thermal conductive insulating layer and electrically connected in series, a first output terminal is provided on the thermoelectric conversion element pair arranged at one end side of the plurality of the thermoelectric conversion element pairs electrically connected in series, and a second output terminal is provided on the thermoelectric conversion element pair arranged the other end side of the plurality of the thermoelectric conversion element pairs electrically connected in series, and an intermediate output terminal is provided at any position between the thermoelectric conversion element pair arranged at the one end side and the thermoelectric conversion element pair arranged at the other end side.

A method for bonding members, in which a first member and a second member between which a temperature difference is generated are bonded to each other, with the thermoelectric conversion module according to any of the above sandwiched therebetween, by using a plurality of fastening members of which fastening forces is adjustable, is characterized by having: a measurement step of measuring at least a first output voltage value generated between the first output terminal and the intermediate output terminal, and a second output voltage value generated between the second output terminal and the intermediate output terminal; and an adjustment step of adjusting the fastening force of each of the fastening members based on a measurement result in the measurement step.

A method for attaching a thermoelectric conversion module, in which the thermoelectric conversion module according to any of the above is attached between a first member and a second member between which a temperature difference is generated, is characterized by having: a measurement step of measuring at least a first output voltage value generated between the first output terminal and the intermediate output terminal, and a second output voltage value generated between the second output terminal and the intermediate output terminal; and an adjustment step of adjusting a fastening force between the first member and the second member based on a measurement result in the measurement step.

Advantageous Effects of Invention

According to the thermoelectric conversion module of the present invention, it is possible to provide a thermoelectric conversion module capable of detecting the distribution of the internal heat flux and obtaining a maximum voltage, in which all thermoelectric conversion elements are connected in series, an insulated circuit substrate, a method for bonding members using the thermoelectric conversion module, and a method for attaching a thermoelectric conversion module.

DESCRIPTION OF EMBODIMENTS

Figure 1:
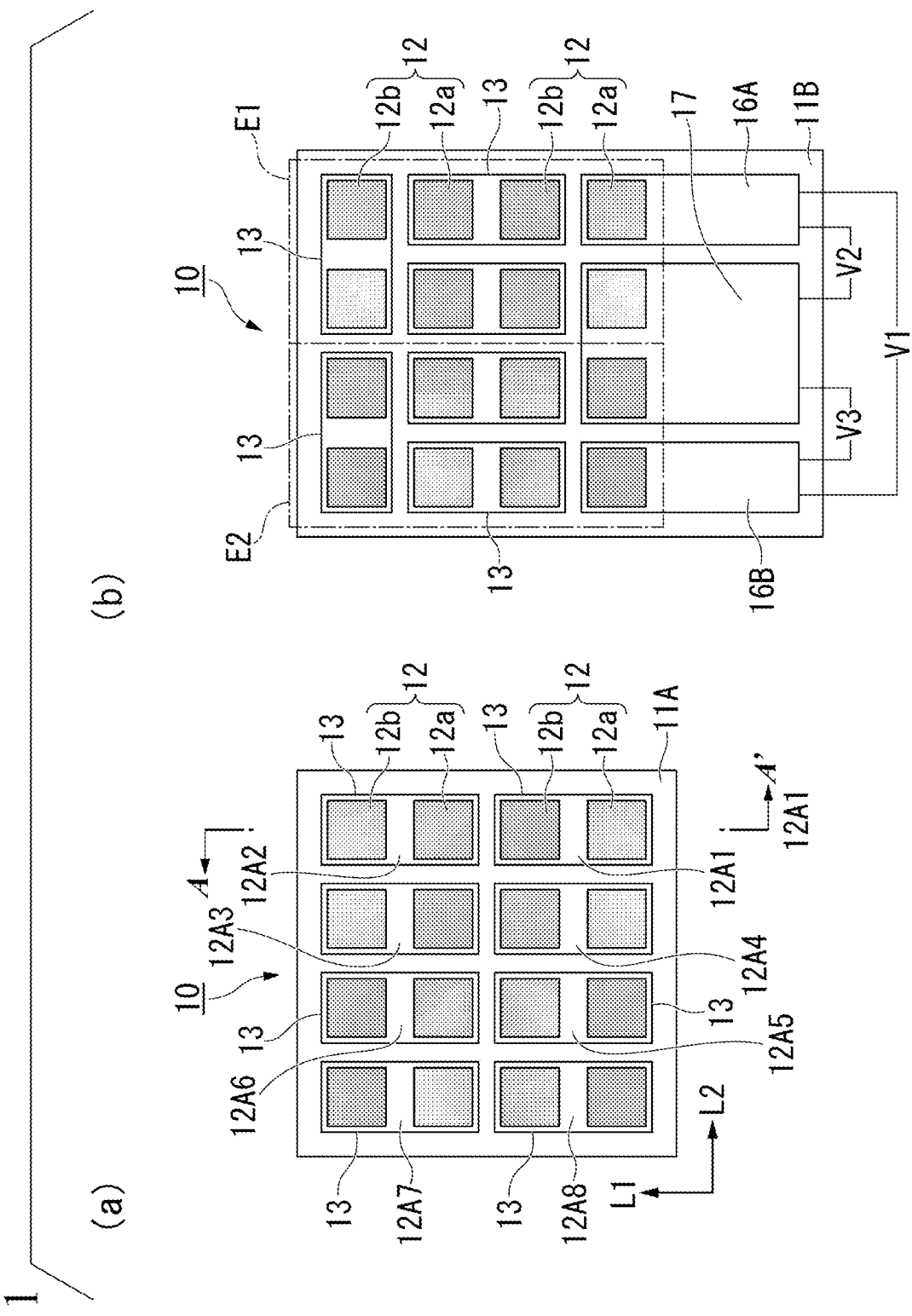
FIG. 1 is a plan view showing a thermoelectric conversion module according to a first embodiment. (a) shows one surface side of the thermoelectric conversion module, and (b) shows the other surface side of the thermoelectric conversion module.

Hereinafter, embodiments of a thermoelectric conversion module of the present invention will be described with reference to the drawings. Each embodiment to be described below is specifically described for a better understanding of the gist of the invention and does not limit the present invention unless otherwise specified. In addition, in the drawings used in the following description, for convenience, a portion that is a main part may be enlarged in some cases in order to make the features of the present invention easy to understand, and a dimensional ratio or the like of each component is not always the same as an actual one.

Thermoelectric Conversion Module: First Embodiment

Figure 2:
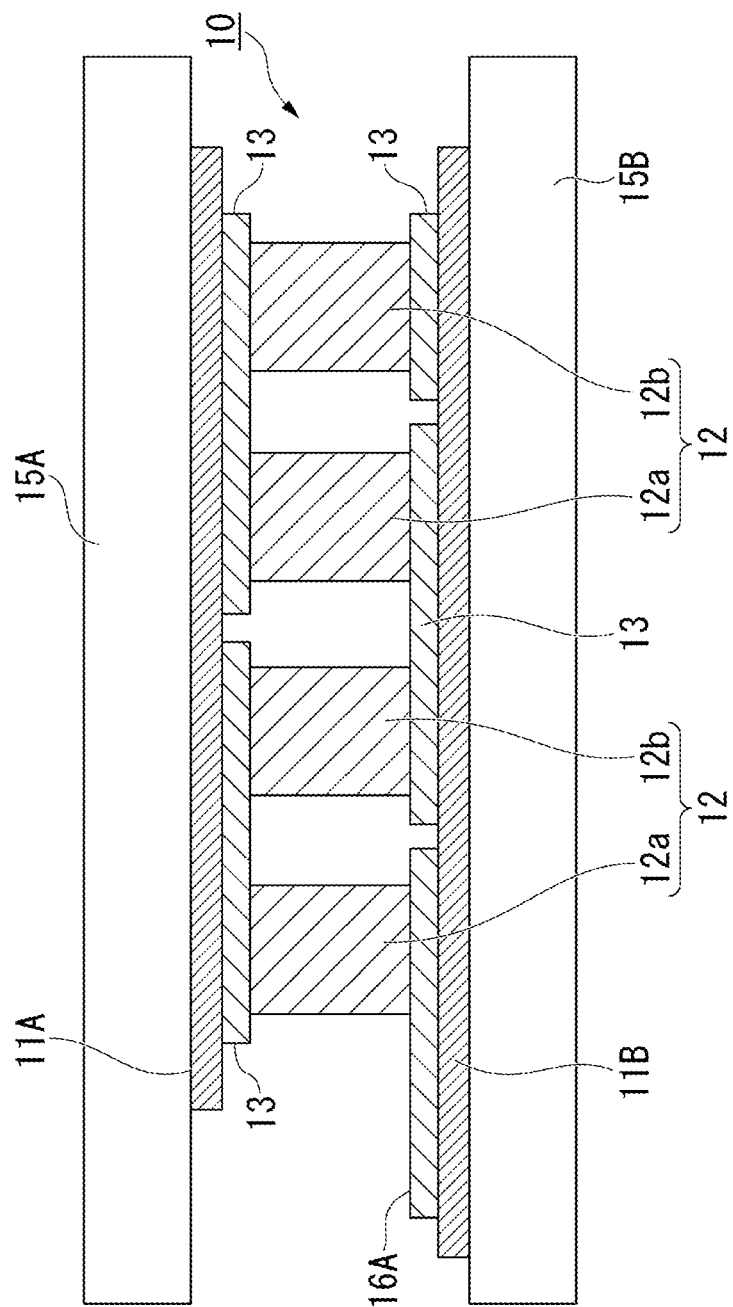
FIG. 2 is a cross-sectional view of the thermoelectric conversion module of the first embodiment, and it is a cross-sectional view taken along the line A-A' in FIG. 1.

FIG. 1 (a) is a plan view showing one surface side of a thermoelectric conversion module of a first embodiment. FIG. 1 (b) is a plan view showing the other surface side of the thermoelectric conversion module of the first embodiment. It is noted that in FIG. 1 (a) and FIG. 1 (b), a thermal conductive insulating layer is omitted in order to make a main part easily viewable. In addition, FIG. 2 is a cross-sectional view of the thermoelectric conversion module along the A-A' line of FIG. 1.

A thermoelectric conversion module 10 of the first embodiment is a π (pi) type thermoelectric conversion module formed by connecting in series thermoelectric conversion materials of p-type and n-type, which are semiconductor types different from each other.

The thermoelectric conversion module 10 has two insulating substrates (thermal conductive insulating layers) 11A and 11B having thermal conductivity, and a plurality of thermoelectric conversion element pairs 12, 12 . . . , which is arranged between the insulating substrates 11A and 11B.

Each thermoelectric conversion element pair 12 has an n-type thermoelectric conversion element 12a, a p-type thermoelectric conversion element 12b, and an electrode plate 13 that electrically connects the n-type thermoelectric conversion element 12a and the p-type thermoelectric conversion element 12b.

Further, the plurality of the thermoelectric conversion element pairs 12 is connected to be electrically in series with each other by interposing the electrode plate 13. That is, the plurality of the thermoelectric conversion element pairs 12 connected in series consists of n-type thermoelectric conversion elements 12a and p-type thermoelectric conversion elements 12b, which are alternately connected by interposing the electrode plate 13.

Figure 3:
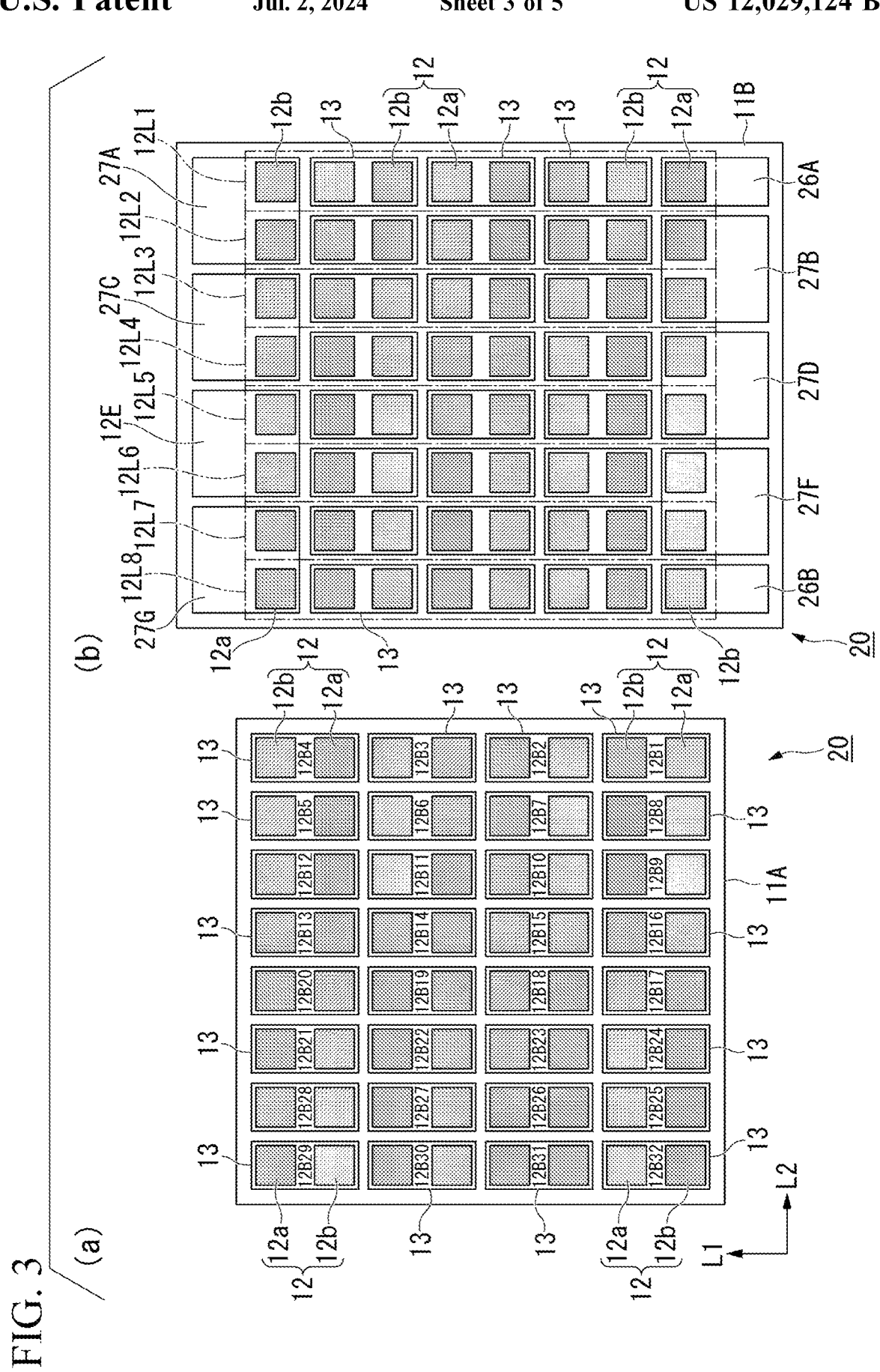
FIG. 3 is a plan view showing a thermoelectric conversion module according to a second embodiment. (a) shows one surface side of the thermoelectric conversion module, and (b) shows the other surface side of the thermoelectric conversion module.

Specifically, as shown in FIG. 3, a plurality of thermoelectric conversion element pairs 12 in which the upper end side of one pair of the n-type thermoelectric conversion element 12a and the p-type thermoelectric conversion element 12b is connected to be a π-shape with a first electrode plate 13 are prepared, and the plurality of the thermoelectric conversion element pairs 12 is arranged so that the n-type thermoelectric conversion elements 12a and the p-type thermoelectric conversion elements 12b are alternately positioned. Next, a second electrode plate 13 is arranged on the lower end side of the n-type thermoelectric conversion element 12a of the thermoelectric conversion element pair 12 and connected to the lower end part of the p-type thermoelectric conversion element 12b of the adjacent thermoelectric conversion element pair 12. Further, a third electrode plate 13 is arranged on the lower end side of the p-type thermoelectric conversion element 12b of the thermoelectric conversion element pair 12 and connected to the lower end part of the n-type thermoelectric conversion element 12a of the adjacent thermoelectric conversion element pair 12. By repeating this, the plurality of the thermoelectric conversion element pairs 12 is connected to be electrically in series with each other.

In the thermoelectric conversion module 10, a first member 15A is provided in contact with the insulating substrate 11A. Further, a second member 15B is provided in contact with the insulating substrate 11B. There is a predetermined temperature difference between the temperature of the first member 15A and the temperature of the second member 15B. In the present embodiment, the first member 15A is on the high temperature side and the second member 15B is on the low temperature side. As a result, heat is transferred from the first member 15A to the second member 15B by interposing the thermoelectric conversion module 10.

In the insulating substrates 11A and 11B, it is possible to use a material having insulating properties and excellent thermal conductivity, for example, one or more plate materials selected from silicon carbide (SiC), silicon nitride ($Si_3N_4$), aluminum nitride (AlN), aluminum oxide ($Al_2O_3$), and sialon. Further, in the insulating substrates 11A and 11B, it is possible to use a composite substrate in which a conductive metal material is used as a base material and an insulating layer such as a resin film or a ceramic thin film is formed in the periphery thereof. A resin having heat resistance may be used as a material of the insulating substrates 11A and 11B.

Such insulating substrates 11A and 11B are media that apply heat to the thermoelectric conversion element pair 12 or absorb heat therefrom. The thermal conductivity of the insulating substrates 11A and 11B is preferably 20 W/(mK) or more in a case where the materials of the insulating substrates 11A and 11B are ceramics, and it is preferably 1 W/(mK) or more in a case where the materials of the insulating substrates 11A and 11B is a resin.

The n-type thermoelectric conversion element 12a and the p-type thermoelectric conversion element 12b are formed of, for example, a sintered body made of one or more materials selected from a tellurium compound, a skutterudite, a filled skutterudite, a Heusler, a half-Heusler, a clathrate, a silicide, an oxide, and silicon-germanium.

As a constituent material of the n-type thermoelectric conversion element 12a, it is possible to use, for example, one or more selected from $Bi_2Te_3$, PbTe, $La_3Te_4$, $CoSb_3$, FeVAl, ZrNiSn, $Ba_8Al_{16}Si_{30}$, $Mg_2Si$, $FeSi_2$, $SrTiO_3$, $CaMnO_3$, ZnO, and SiGe.

The n-type thermoelectric conversion element 12a of the present embodiment uses a half-Heusler-based material.

In addition, as a constituent material of the p-type thermoelectric conversion element 12b, it is possible to use, for example, one or more selected from $Bi_2Te_3$, $Sb_2Te_3$, PbTe, TAGS (=Ag—Sb—Ge—Te), $Zn_4Sb_3$, $CoSb_3$, $CeFe_4Sb_{12}$, $Yb_{14}MnSb_{11}$, FeVAl, $MnSi_{1.73}$, $FeSi_2$, $NaxCoO_2$ $Ca_3Co_4O_7$, $Bi_2Sr_2Co_2O_7$, and SiGe.

The p-type thermoelectric conversion element 12b of the present embodiment uses a half-Heusler-based material.

In the electrode plate 13 that connects the n-type thermoelectric conversion element 12a and the p-type thermoelectric conversion element 12b, which constitute the thermoelectric conversion element pair 12, or connects the n-type thermoelectric conversion element 12a and the p-type thermoelectric conversion element 12b between the thermoelectric conversion element pairs 12 and 12, which are adjacent to each other, it is possible to use a thin plate made of a metal material having excellent conductivity, for example, one or more materials selected from silver (Ag), aluminum (Al), copper (Cu), and an alloy thereof. The electrode plate 13 of the present embodiment is formed of a sintered product of Ag.

It is noted that in addition to this, a sealing layer made of an insulating material may be formed so that a gap between the n-type thermoelectric conversion element 12a and the p-type thermoelectric conversion element 12b or the periphery of the region where a plurality of thermoelectric conversion element pairs 12 is arranged is covered. As the sealing layer, it is possible to use, for example, one or two or more selected from aluminum oxide ($Al_2O_3$), magnesium oxide (MgO), zirconium oxide ($ZrO_2$), and silica ($SiO_2$).

Further, it is also possible to form an intermediate layer that enhances thermal conductivity or bondability between the electrode plate 13 and the insulating substrate 11A or between the electrode plate 13 and the insulating substrate 11B.

In the thermoelectric conversion module 10 of the present embodiment, a total of eight thermoelectric conversion element pairs 12A1 to 12A8 are formed in one plane, for example, in two rows toward a first direction L1 and four rows toward a second direction L2 on one surface of the insulating substrate 11A. In addition, the n-type thermoelectric conversion element 12a and the p-type thermoelectric conversion element 12b, which constitute each of these thermoelectric conversion element pairs 12A1 to 12A8, are electrically connected in series by interposing the electrode plate 13.

Specifically, from the n-type thermoelectric conversion element 12a at the lower right of FIG. 1 toward the upper side of the first direction L1, the p-type thermoelectric conversion element 12b and the n-type thermoelectric conversion element 12a are connected, in this order, up to the p-type thermoelectric conversion elements 12b at the upper right. From here, the connection is continued to the n-type thermoelectric conversion element 12a in the adjacent row toward the second direction L2, and the p-type thermoelectric conversion element 12b and the n-type thermoelectric conversion element 12a are connected, in this order, along the lower side of the first direction L1.

In this way, from the n-type thermoelectric conversion element 12a (the thermoelectric conversion element pair 12A1) at the lower right toward the p-type thermoelectric conversion element 12b (the thermoelectric conversion element pair 12A8) at the lower left while turning back three times in a crank shape, the p-type thermoelectric conversion element 12b and the n-type thermoelectric conversion element 12a are alternately connected, by interposing the electrode plate 13, to constitute a continuous series circuit.

In addition, a first output terminal 16A is formed in the n-type thermoelectric conversion element 12a constituting the thermoelectric conversion element pair 12A1. Further, a second output terminal 16B is formed in the p-type thermoelectric conversion element 12b constituting the thermoelectric conversion element pair 12A8.

Further, the electrode plate 13 that connects the p-type thermoelectric conversion element 12b constituting the thermoelectric conversion element pair 12A4 and the n-type thermoelectric conversion element 12a constituting the thermoelectric conversion element pair 12A5 serves as an intermediate output terminal 17.

The operation of the thermoelectric conversion module 10 of the first embodiment having the above configuration will be described.

In a case where the thermoelectric conversion module 10 is used as a Seebeck element that extracts power by utilizing the temperature difference, the thermoelectric conversion module 10 is sandwiched between the first member 15A (the high temperature side) and the second member 15B (the low temperature side) between which a temperature difference is generated, and the first member 15A and the second member 15B are bonded.

In the thermoelectric conversion module 10 arranged between the first member 15A (the high temperature side) and the second member 15B (the low temperature side), a temperature difference is generated between the insulating substrate 11A in contact with the first member 15A and the insulating substrate 11B in contact with second member 15B, and as a result, a potential difference is generated in each of the thermoelectric conversion element pairs 12A1 to 12A8.

Then, a voltage V1 is generated between the first output terminal 16A and the second output terminal 16B, where the voltage V1 is the sum of the potential differences of all (eight) thermoelectric conversion element pairs 12A1 to 12A8 connected in series. On the other hand, a voltage V2 is generated between the first output terminal 16A and the intermediate output terminal 17, where the voltage V2 is the sum of the potential differences of four thermoelectric conversion element pairs 12A1 to 12A4.

Further, a voltage V3 is generated between the intermediate output terminal 17 and the second output terminal 16B, where the voltage V3 is the sum of the potential differences of four thermoelectric conversion element pairs 12A5 to 12A8. In a case where the temperature difference generated between the thermoelectric conversion element pairs 12A1 to 12A8 is uniform without bias, the voltages V2 and V3 are each about half of the voltage V1.

In this way, in a case where all the thermoelectric conversion element pairs 12A1 to 12A8 are connected in series, each of the first output terminal 16A and the second output terminal 16B are provided at both ends thereof, and further, the intermediate output terminal 17 is formed at the intermediate portion (the connecting portion between the thermoelectric conversion element pair 12A4 and the thermoelectric conversion element pair 12A5) of the thermoelectric conversion element pair 12A1 to 12A8, it is possible to selectively supply the power of the voltage V1 which is the sum of the potential differences of all the thermoelectric conversion element pairs 12A1 to 12A8 and the power of the voltages V2 and V3 lower than the voltage V1, which are generated by any number of thermoelectric conversion element pairs 12. In the present embodiment, it is possible to supply one system having a power of a maximum voltage of V1 or two systems having powers of voltages V2 and V3 which are about half of V1.

Further, since the potential difference generated in each thermoelectric conversion element pair 12 changes depending on the heat flux applied to each thermoelectric conversion element pair 12, it is possible to detect the distribution and bias of the heat flux applied to the thermoelectric conversion module 10 by forming the intermediate output terminal 17 and measuring the voltage generated in the thermoelectric conversion element pair 12 at any portion of the thermoelectric conversion element pairs 12A1 to 12A8.

For example, in the present embodiment, it is possible to detect the difference between the heat flux applied to the right half E1 of the thermoelectric conversion module 10 of FIG. 1 and the heat flux applied to the left half E2 by forming the intermediate output terminal 17 and comparing the voltages of the thermoelectric conversion element pairs 12A1 to 12A4 with the voltages of the thermoelectric conversion element pairs 12A5 to 12A8.

Since the heat flux of the thermoelectric conversion module 10 also changes depending on the contact force with respect to the first member 15A and the second member 15B, it is possible to detect the bonding state of the first member 15A and the second member 15B that sandwich the thermoelectric conversion module 10, that is, the bias of the bonding force between the right half and the left half of the first member 15A and the second member 15B, by detecting the difference between the heat flux applied to the right half E1 and the heat flux applied to the left half E2 of such a thermoelectric conversion module 10 of FIG. 1.

As described above, according to the thermoelectric conversion module 10 of the present embodiment, it is possible to detect the distribution of the internal heat flux, and it is possible to obtain the maximum voltage which is obtained when all the thermoelectric conversion elements are connected in series and a partial voltage lower than the maximum voltage, which is obtained when any number of thermoelectric conversion elements are connected in series.

Thermoelectric Conversion Module: Second Embodiment

FIG. 3 (a) is a plan view showing one surface side of a thermoelectric conversion module of a second embodiment. FIG. 3 (b) is a plan view showing the other surface side of the thermoelectric conversion module of the second embodiment. It is noted that in FIG. 3 (a) and FIG. 3 (b), a thermal conductive insulating layer is omitted in order to make a main part easily viewable. Further, in the following description of the thermoelectric conversion module of the second embodiment, the same number is given to the same configuration as that of the first embodiment, and the duplicated description thereof will be omitted.

In the thermoelectric conversion module 20 of the second embodiment, a total of 32 thermoelectric conversion element pairs 12B1 to 12B32 are formed in one plane, for example, in four rows toward the first direction L1 and eight rows toward the second direction L2 on one surface of the insulating substrate 11B. In addition, the n-type thermoelectric conversion element 12a and the p-type thermoelectric conversion element 12b, which constitute each of these thermoelectric conversion element pairs 12B1 to 12B32, are electrically connected in series by interposing the electrode plate 13.

Specifically, from the n-type thermoelectric conversion element 12a at the lower right of FIG. 1 toward the upper side of the first direction L1, the p-type thermoelectric conversion element 12b and the n-type thermoelectric conversion element 12a are connected, in this order, up to the p-type thermoelectric conversion elements 12b at the upper right. From here, the connection is continued to the n-type thermoelectric conversion element 12a in the adjacent row toward the second direction L2, and the p-type thermoelectric conversion element 12b and the n-type thermoelectric conversion element 12a are connected, in this order, along the lower side of the first direction L1.

In this way, from the n-type thermoelectric conversion element 12a (the thermoelectric conversion element pair 12B1) at the lower right toward the p-type thermoelectric conversion element 12b (the thermoelectric conversion element pair 12B32) at the lower left while turning back seven times in a crank shape, the p-type thermoelectric conversion element 12b and the n-type thermoelectric conversion element 12a are alternately connected, by interposing the electrode plate 13, to constitute a continuous series circuit.

In the following description, the thermoelectric conversion element pair 12B1 to the thermoelectric conversion element pair 12B4 along the first direction L1 will be referred to as a thermoelectric conversion element pair row 12L1. In addition, the thermoelectric conversion element pair 12B5 to the thermoelectric conversion element pair 12B8 along the first direction L1 will be referred to as a thermoelectric conversion element pair row 12L2. Similarly, the thermoelectric conversion element pair 12B9 to the thermoelectric conversion element pair 12B12 will be referred to as a thermoelectric conversion element pair row 12L3, the thermoelectric conversion element pair 12B13 to the thermoelectric conversion element pair 12B16 will be referred to as a thermoelectric conversion element pair row 12L4, the thermoelectric conversion element pair 12B17 to the thermoelectric conversion element pair 12B20 will be referred to as a thermoelectric conversion element pair row 12L5, the thermoelectric conversion element pair 12B21 to the thermoelectric conversion element pair 12B24 will be referred to as a thermoelectric conversion element pair row 12L6, the thermoelectric conversion element pair 12B25 to the thermoelectric conversion element pair 12B28 will be referred to as a thermoelectric conversion element pair row 12L7, and the thermoelectric conversion element pair 12B29 to the thermoelectric conversion element pair 12B32 will be referred to as a thermoelectric conversion element pair row 12L8.

A first output terminal 26A is formed in the n-type thermoelectric conversion element 12a constituting the thermoelectric conversion element pair 12B1. Further, a second output terminal 26B is formed in the p-type thermoelectric conversion element 12b constituting the thermoelectric conversion element pair 12B32.

Further, the electrode plate 13 that connects the thermoelectric conversion element pair row 12L1 and the thermoelectric conversion element pair row 12L2 serves as an intermediate output terminal 27A. Further, the electrode plate 13 that connects the thermoelectric conversion element pair row 12L2 and the thermoelectric conversion element pair row 12L3 serves as an intermediate output terminal 27B. Similarly, the electrode plate 13 that connects the thermoelectric conversion element pair row 12L3 and the thermoelectric conversion element pair row 12L4 serves as an intermediate output terminal 27C, the electrode plate 13 that connects the thermoelectric conversion element pair row 12L4 and the thermoelectric conversion element pair row 12L5 serves as an intermediate output terminal 27D, the electrode plate 13 that connects the thermoelectric conversion element pair row 12L5 and the thermoelectric conversion element pair row 12L6 serves as an intermediate output terminal 27E, the electrode plate 13 that connects the thermoelectric conversion element pair row 12L6 and the thermoelectric conversion element pair row 12L7 serves as an intermediate output terminal 27F, and the electrode plate 13 that connects the thermoelectric conversion element pair row 12L7 and the thermoelectric conversion element pair row 12L8 serves as an intermediate output terminal 27G.

The operation of the thermoelectric conversion module 20 of the second embodiment having the above configuration will be described.

In a case where the thermoelectric conversion module 20 is used as a thermoelectric conversion element that extracts power by utilizing the temperature difference, the thermoelectric conversion module 20 is sandwiched between the first member 15A (the high temperature side: see FIG. 1) and the second member 15B (the low temperature side: see FIG. 1) between which a temperature difference is generated, and the first member 15A and the second member 15B are bonded.

In the thermoelectric conversion module 20 arranged between the first member 15A (the high temperature side)

and the second member 15B (the low temperature side), a temperature difference is generated between the insulating substrate 11A in contact with the first member 15A and the insulating substrate 11B in contact with second member 15B, and as a result, a potential difference is generated in each of the thermoelectric conversion element pairs 12B1 to 12B32.

Then, a voltage Va is generated between the first output terminal 26A and the second output terminal 26B, where the voltage Va is the sum of the potential differences of all (32) thermoelectric conversion element pairs 12B1 to 12B32 connected in series. On the other hand, a voltage Vs1 of the thermoelectric conversion element pair row 12L1 is generated between the first output terminal 26A and the intermediate output terminal 27A. In addition, a voltage Vs2 of the thermoelectric conversion element pair row 12L2 is generated between the intermediate output terminal 27A and the intermediate output terminal 27B.

Similarly, a voltage Vs3 of the thermoelectric conversion element pair row 12L3 is generated between the intermediate output terminal 27B and the intermediate output terminal 27C, a voltage Vs4 of the thermoelectric conversion element pair row 12L4 is generated between the intermediate output terminal 27C and the intermediate output terminal 27D, a voltage Vs5 of the thermoelectric conversion element pair row 12L5 is generated between the intermediate output terminal 27D and the intermediate output terminal 27E, a voltage Vs6 of the thermoelectric conversion element pair row 12L6 is generated between the intermediate output terminal 27E and the intermediate output terminal 27F, and a voltage Vs7 of the thermoelectric conversion element pair row 12L7 is generated between the intermediate output terminal 27F and the intermediate output terminal 27G. In addition, a voltage Vs8 of the thermoelectric conversion element pair row 12L8 is generated between the intermediate output terminal 27G and the second output terminal 26B.

When the temperature difference generated between the thermoelectric conversion element pairs 12B1 to 12B32 is uniform without bias, the voltages Vs1 to Vs8 are each about ⅛ of the voltage V1.

In this way, when all the thermoelectric conversion element pairs 12B1 to 12B32 are connected in series, each of the first output terminal 26A and the second output terminal 26B are provided at both ends thereof, and further, the intermediate output terminals 27A to 27G are formed at the connecting portion of each of the thermoelectric conversion element pair row 12L1 to 12L8 adjacent to each other, it is possible to selectively supply the power of the voltage Va which is the sum of the potential differences of all the thermoelectric conversion element pairs 12B1 to 12B32 and the power of the voltages Vs1 to Vs8 lower than the voltage Va, which are generated in each of the thermoelectric conversion element pair rows 12L1 to 12L8. In the present embodiment, it is possible to supply one system having a power of a maximum voltage of Va or eight systems having powers of voltages Vs1 to Vs8 which are about ⅛ of Va.

It is noted that it is also possible to extract power from any two intermediate output terminals 27A to 27G so that two or more adjacent thermoelectric conversion element pair rows 12L1 to 12L8 are connected in series.

Further, since the potential difference generated in each thermoelectric conversion element pair 12 changes depending on the heat flux applied to each thermoelectric conversion element pair 12, it is possible to detect the distribution and bias of the heat flux applied to the thermoelectric conversion module 20 by forming the intermediate output terminals 27A to 27G and measuring the voltage generated in each of the thermoelectric conversion element pair rows 12L1 to 12L8.

For example, in the present embodiment, it is possible to detect the mutual difference in heat flux for each region which is obtained by carrying out division into eight regions in a strip shape along the first direction L1 of the thermoelectric conversion module 20 in FIG. 3, by forming the intermediate output terminals 27A to 27G and comparing the respective voltages Vs1 to Vs8 of the thermoelectric conversion element pair rows 12L1 to 12L8 with each other.

Since the heat flux of the thermoelectric conversion module 20 also changes depending on the contact force with respect to the first member 15A (see FIG. 1) and the second member 15B (see FIG. 1), it is possible to detect the bonding state of the first member 15A and the second member 15B that are installed to sandwich such a thermoelectric conversion module 20, that is, the bias of the bonding force in the second direction L2 of the first member 15A and the second member 15B.

Thermoelectric Conversion Module: Third Embodiment

Figure 4:
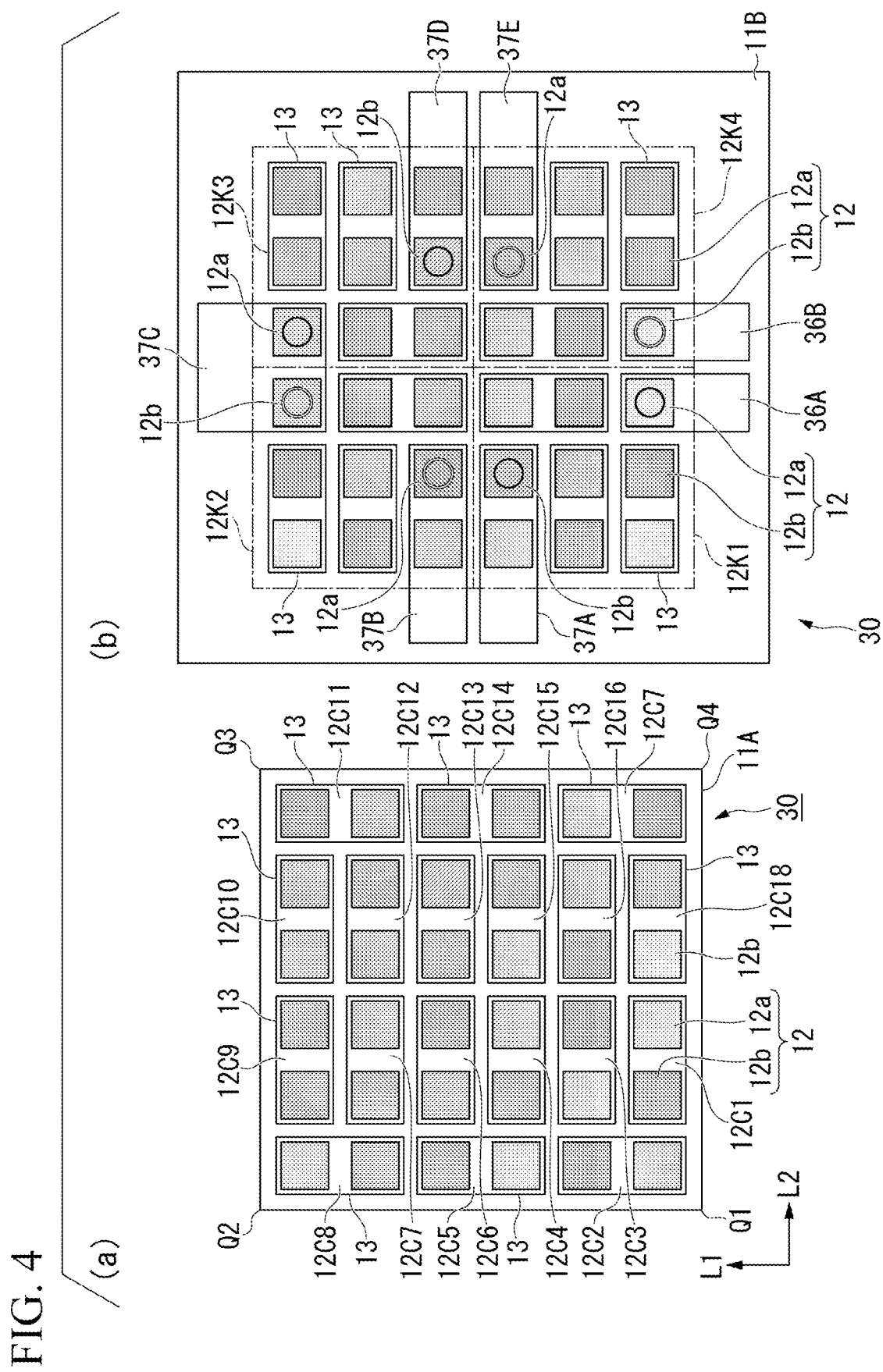
FIG. 4 is a plan view showing a thermoelectric conversion module according to a third embodiment. (a) shows one surface side of the thermoelectric conversion module, and (b) shows the other surface side of the thermoelectric conversion module.

FIG. 4 (a) is a plan view showing one surface side of a thermoelectric conversion module of a third embodiment. FIG. 4 (b) is a plan view showing the other surface side of the thermoelectric conversion module of the third embodiment. It is noted that in FIG. 4 (a) and FIG. 4 (b), a thermal conductive insulating layer is omitted in order to make a main part easily viewable. Further, in the following description of the thermoelectric conversion module of the third embodiment, the same number is given to the same configuration as that of the first embodiment, and the duplicated description thereof will be omitted.

In the thermoelectric conversion module 30 of the third embodiment, a total of 18 thermoelectric conversion element pairs 12C1 to 12C18 are formed in one plane, for example, toward the first direction L1 and the second direction L2 on one surface of the insulating substrate 11B. In addition, the n-type thermoelectric conversion element 12a and the p-type thermoelectric conversion element 12b, which constitute each of these thermoelectric conversion element pairs 12C1 to 12C18, are electrically connected in series by interposing the electrode plate 13.

Specifically, with the thermoelectric conversion element pairs 12C1 to 12C18 which are arranged on one surface of the insulating substrate 11B to form a rectangle as a whole along the first direction L1 and the second direction L2, the compartmentation into four small regions including each of the angular parts Q1 to Q4 of the four corners of the rectangle is achieved to form thermoelectric conversion element pair compartment bodies 12K1 to 12K4 in which the thermoelectric conversion element pairs 12 arranged in each of the small regions are connected in series, and four thermoelectric conversion element pair compartment bodies 12K1 to 12K4 are connected in series, in this order, to constitute a continuous series circuit.

Figure 5:
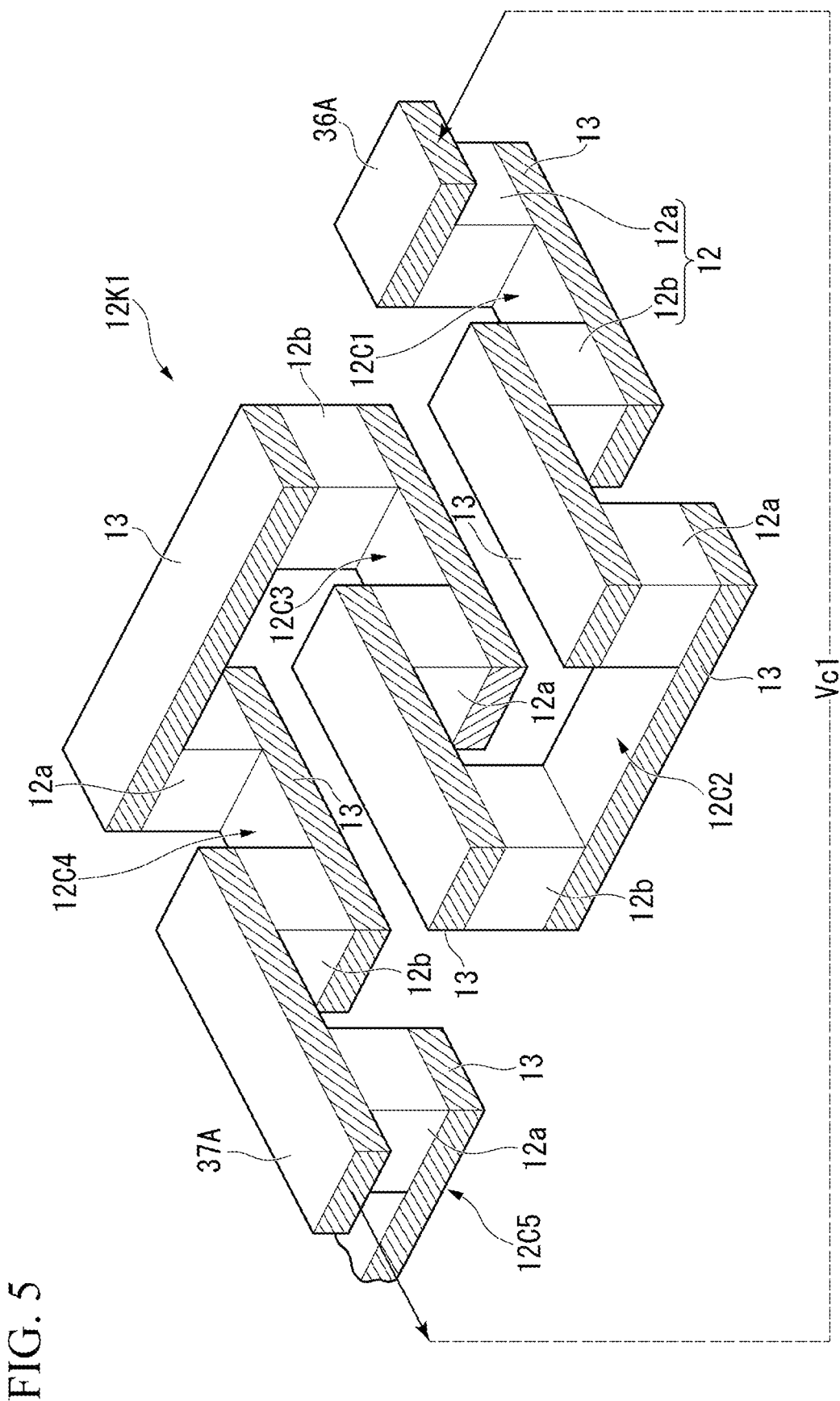
FIG. 5 is a schematic diagram showing a thermoelectric conversion element pair compartment body constituting a thermoelectric conversion module.

FIG. 5 is a schematic view of the thermoelectric conversion element pair compartment body 12K1 that is formed in the lower right of FIG. 4, which is one of such thermoelectric conversion element pair compartment bodies.

A plurality of thermoelectric conversion element pairs 12 is connected to each other, by interposing the electrode plate 13, to constitute such a thermoelectric conversion element pair compartment body 12K1 and the thermoelectric conversion element pair compartment bodies 12K2 to 12K4, which are formed to be symmetrical to the thermoelectric conversion element pair compartment body 12K1.

A first output terminal 36A is formed in the n-type thermoelectric conversion element 12a constituting the thermoelectric conversion element pair 12C1. Further, a second output terminal 36B is formed in the p-type thermoelectric conversion element 12b constituting the thermoelectric conversion element pair 12C18.

Further, the electrode plate 13 that connects the thermoelectric conversion element pair 12C4 and the thermoelectric conversion element pair 12C5 serves as an intermediate output terminal 37A. Further, the electrode plate 13 that connects the thermoelectric conversion element pair 12C5 and the thermoelectric conversion element pair 12C6 serves as an intermediate output terminal 37B. Similarly, the electrode plate 13 that connects the thermoelectric conversion element pair 12C9 and the thermoelectric conversion element pair 12C10 serves as an intermediate output terminal 37C, the electrode plate 13 that connects the thermoelectric conversion element pair 12C13 and the thermoelectric conversion element pair 12C14 serves as an intermediate output terminal 37D, and the electrode plate 13 that connects the thermoelectric conversion element pair 12C15 and the thermoelectric conversion element pair 12C16 serves as an intermediate output terminal 37E.

The operation of the thermoelectric conversion module 30 of the third embodiment having the above configuration will be described.

In a case where the thermoelectric conversion module 30 is used as a Seebeck element that extracts power by utilizing the temperature difference, the thermoelectric conversion module 30 is sandwiched between the first member 15A (the high temperature side: see FIG. 1) and the second member 15B (the low temperature side: see FIG. 1) between which a temperature difference is generated, and the first member 15A and the second member 15B are bonded.

In the thermoelectric conversion module 30 arranged between the first member 15A (the high temperature side) and the second member 15B (the low temperature side), a temperature difference is generated between the insulating substrate 11A in contact with the first member 15A and the insulating substrate 11B in contact with second member 15B, and as a result, a potential difference is generated in each of the thermoelectric conversion element pairs 12C1 to 12C18.

Then, a voltage Vb is generated between the first output terminal 36A and the second output terminal 36B, where the voltage Vb is the sum of the potential differences of all (18) thermoelectric conversion element pairs 12C1 to 12C18 connected in series. On the other hand, a voltage Vc1 of the thermoelectric conversion element pair 12C1 to 12C4 is generated between the first output terminal 36A and the intermediate output terminal 37A. In addition, a voltage Vc2 of the thermoelectric conversion element pairs 12C6 to 12C9 is generated between the intermediate output terminal 37B and the intermediate output terminal 37C. In addition, a voltage Vc3 of the thermoelectric conversion element pairs 12C10 to 12C13 is generated between the intermediate output terminal 37C and the intermediate output terminal 37D. In addition, a voltage Vc4 of the thermoelectric conversion element pairs 12C15 to 12C18 is generated between the intermediate output terminal 37A and the second output terminal 36B.

Such voltages Vc1 to Vc4 correspond to the voltages each generated in the thermoelectric conversion element pair compartment bodies 12K2 to 12K4. That is, it is possible to measure the heat flux for each of the four small regions including each of the angular parts Q1 to Q4 of the four corners of the rectangular region where the thermoelectric conversion element pairs 12C1 to 12C18 are arranged.

In such a thermoelectric conversion module 30, it is possible to selectively supply the power of the voltage Vb which is the sum of the potential differences of all the thermoelectric conversion element pairs 12C1 to 12C18 and the power of the voltages Vc1 to Vc4 lower than the voltage Vb, which are generated in each of the thermoelectric conversion element pair compartment body 12K2 to 12K4. In the present embodiment, it is possible to supply one system having a power of a maximum voltage of Vb or four systems having powers of voltages Vc1 to Vc4 which are lower than Vb.

Further, since the potential difference generated in each thermoelectric conversion element pair 12 changes depending on the heat flux applied to each thermoelectric conversion element pair 12, it is possible to detect the distribution and bias of the heat flux applied to the thermoelectric conversion module 20 by forming the intermediate output terminals 37A to 37E and measuring the voltage generated in each of the thermoelectric conversion element pair compartment bodies 12K2 to 12K4.

For example, in the present embodiment, it is possible to detect the mutual difference in heat flux for each small region which is obtained by carrying out division into four regions and includes each of the four corners of the rectangle of the thermoelectric conversion module 30 in FIG. 4, by forming the intermediate output terminals 37A to 37E and comparing the respective voltages Vc1 to Vc4 of the thermoelectric conversion element pair compartment bodies 12K2 to 12K4 with each other.

Since the heat flux of the thermoelectric conversion module 30 also changes depending on the contact force with respect to the first member 15A and the second member 15B, it is possible to detect the bias of the bonding forces in four corners of the first member 15A and the second member 15B, by bonding, in the four corners, the first member 15A and the second member 15B that are installed to sandwich such a thermoelectric conversion module 30.

(Insulated Circuit Substrate)

In the insulated circuit substrate of one embodiment of the present invention, a plurality of thermoelectric conversion element pairs 12, in which the n-type thermoelectric conversion element 12a and the p-type thermoelectric conversion element 12b are connected with the electrode plate 13, is connected in series and arranged on the insulating substrate (the thermal conductive insulating layer) 11B shown in FIG. 1 and FIG. 2. In addition, the first output terminal 16A is formed in the thermoelectric conversion element pair 12 on one end side, and the second output terminal 16B is formed in the thermoelectric conversion element pair 12 arranged at the other end side, among the plurality of the thermoelectric conversion element pairs 12, 12 . . . connected in series. Further, the intermediate output terminal 17 is formed between the thermoelectric conversion element pairs 12 at one end and the other end.

(Method for Bonding Members)

One embodiment of a method for bonding members of the present invention using the thermoelectric conversion module of the third embodiment shown in FIG. 4 and FIG. 5 will be described.

The present embodiment assumes a case where the first member 15A (the high temperature side: see FIG. 1) and the second member 15B (the low temperature side: see FIG. 1) between which a temperature difference is generated are bonded with bolts (fastening members) so that the thermoelectric conversion module 30 is sandwiched therebetween.

First, the first member 15A and the second member 15B are arranged with the thermoelectric conversion module 30 sandwiched therebetween. Then, the four corners of the first member 15A and the second member 15B are fastened with screws so that the vicinity of each of the angular parts of the rectangular thermoelectric conversion module 30 is tightened.

Then, measurement is carried out to measure each of the voltage Vc1 (the first output voltage value) generated between the first output terminal 36A and the intermediate output terminal 37A of the thermoelectric conversion module 30, the voltage Vc4 (the second output voltage value) generated between the intermediate output terminal 37E and the second output terminal 36B thereof, the voltage Vc2 (the third output voltage value) generated between the intermediate output terminal 37B and the intermediate output terminal 37C thereof, the voltage Vc3 (the fourth output voltage value) generated between the intermediate output terminal 37C and the intermediate output terminal 37D thereof (the measurement step).

Such voltages Vc1 to Vc4 are heat fluxes of the thermoelectric conversion element pair compartment bodies 12K2 to 12K4, that is, the heat flux for each small region which is obtained by carrying out division into four regions and includes each of the four corners of the rectangle of thermoelectric conversion module 30. Since the heat flux of the thermoelectric conversion module 30 changes depending on the contact force of the thermoelectric conversion module 30 with respect to the first member 15A and the second member 15B, that is, the fastening force between the first member 15A and the second member 15B, it is possible to know the bias of the fastening force between the bolts (the fastening members), each of which fastens the four corners of the first member 15A and the second member 15B, by measuring the voltages Vc1 to Vc4 and comparing them with each other.

Then, the first member 15A and the second member 15B are bonded while adjusting the fastening forces of the bolts (the fastening members) at the four corners so that the measured voltages Vc1 to Vc4 are equal (the adjustment step). According to the method for bonding members of the present embodiment, the first member 15A and the second member 15B, which generate a temperature difference in the thermoelectric conversion module 30 can be brought into contact with the thermoelectric conversion module 30 with an equal contact force without bias, on the contact surface with respect to the thermoelectric conversion module 30. This makes it possible for the thermoelectric conversion module 30 to carry out power generation by thermoelectric conversion with high efficiency and low loss without causing a local decrease in power generation efficiency.

It is noted that the method for bonding members of the present invention is not limited to the case where the thermoelectric conversion module 30 of the third embodiment described above is used. For example, using the thermoelectric conversion module 10 of the first embodiment, the first member 15A and the second member 15B are fastened by equally applying fastening forces to the left and right while comparing the heat fluxes in the left and right regions of the thermoelectric conversion module 10.

(Method for Attaching Thermoelectric Conversion Module)

In a method for attaching the thermoelectric conversion module according to one embodiment of the present invention, the first output voltage value generated between the first output terminal 36A and the intermediate output terminal 37A, the second output voltage value generated between the second output terminal 36B and the intermediate output terminal 37E6, and the like shown in FIG. 4 and FIG. 5 are measured (a measurement step), and a thermoelectric conversion module is attached while adjusting the fastening force between the first member 15A and the second member 15B (an adjustment step) based on the measurement result in this measurement step, like the method for bonding members described above.

Although some embodiments of the present invention have been described above, these embodiments are presented as examples and thus are not intended to limit the scope of the invention. These embodiments can be implemented in various other forms, and various omissions, replacements, and changes can be made without departing from the gist of the invention. These embodiments and the modification thereof are included in the scope of the invention described in the claims and the scope equivalent thereto, as they are included in the scope and gist of the invention.

For example, in the above-described embodiment, although the thermoelectric conversion element pairs connected in series are turned back in a crank shape to form the intermediate output terminal at the turned-back portion, or a plurality of thermoelectric conversion element pairs arranged in a rectangular shape is divided into four parts so that each of them includes an angular part and the intermediate output terminal is formed in each of them, the formation position of the intermediate output terminal is not limited to such an embodiment.

For example, the intermediate output terminals may be formed at unequal spacings between one end and the other end of the thermoelectric conversion element pairs connected in series. In a case of selecting the number of thermoelectric conversion element pairs that are arranged between the first output terminal or second output terminal and the intermediate output terminal, it is possible to output a maximum voltage and a power of a desired voltage lower than this maximum voltage.

REFERENCE SIGNS LIST

10 Thermoelectric conversion module
11A, 11B Insulating substrate (thermal conductive insulating layer)
12 Thermoelectric conversion element pair
12a n-type thermoelectric conversion element
12b p-type thermoelectric conversion element
13 Electrode plate
15A First member
15B Second member
16A First output terminal
16B Second output terminal
17 Intermediate output terminal

What is claimed is:
1. A thermoelectric conversion module comprising:
a thermoelectric conversion element pair in which an n-type thermoelectric conversion element and a p-type thermoelectric conversion element are connected by interposing an electrode plate,
wherein a plurality of thermoelectric conversion element pairs is arranged on one surface and electrically connected in series,
a first output terminal is provided on the thermoelectric conversion element pair arranged at one end side of the plurality of the thermoelectric conversion element pairs electrically connected in series, and a second output terminal is provided on the thermoelectric conversion element pair arranged at an other end side of the plurality of the thermoelectric conversion element pairs electrically connected in series, an intermediate output terminal is provided at any position between the thermoelectric conversion element pair arranged at the one end side and the thermoelectric conversion element pair arranged at the other end side, and thermoelectric conversion element pair rows, which are formed by linearly arranging the plurality of the thermoelectric conversion element pairs along a first direction of the one surface, are aligned in a plurality of rows along a second direction of the one surface and connected in a crank shape to form the intermediate output terminal used as the electrode plate at a connecting portion between the thermoelectric conversion element pair rows adjacent to each other.

2. The thermoelectric conversion module according to claim 1,
wherein the intermediate output terminals are provided at two or more positions different from each other between the thermoelectric conversion element pair arranged at the one end side and the thermoelectric conversion element pair arranged at the other end side.

3. The thermoelectric conversion module according to claim 1,
wherein the plurality of the thermoelectric conversion element pairs is arranged along a first direction and a second direction of the one surface to form a rectangle as a whole,
the plurality of the thermoelectric conversion element pairs is comparted into four regions each including one angular part of four corners of the rectangle to form a thermoelectric conversion element pair compartment body in which the thermoelectric conversion element pairs for each region are connected in series, and
four thermoelectric conversion element pair compartment bodies are connected in series to form the intermediate output terminal in the thermoelectric conversion element pair at a position where the thermoelectric conversion element pair compartment bodies are connected to each other.

4. The thermoelectric conversion module according to claim 1, further comprising:
a first thermal conductive insulating layer in contact with the thermoelectric conversion element pair on the one surface; and
a second thermal conductive insulating layer in contact with the thermoelectric conversion element pair on the other surface facing the one surface.

5. A method for bonding members, in which a first member and a second member between which a temperature difference is generated are bonded to each other, with the thermoelectric conversion module according to claim 1 sandwiched therebetween, by using a plurality of fastening members of which fastening forces is adjustable, the method comprising:
a measurement step of measuring at least a first output voltage value generated between the first output terminal and the intermediate output terminal, and a second output voltage value generated between the second output terminal and the intermediate output terminal; and an adjustment step of adjusting the fastening force of each of the fastening members based on a measurement result in the measurement step.

6. A method for attaching a thermoelectric conversion module, in which the thermoelectric conversion module according to claim 1 is attached between a first member and a second member between which a temperature difference is generated, the method comprising:
a measurement step of measuring at least a first output voltage value generated between the first output terminal and the intermediate output terminal, and a second output voltage value generated between the second output terminal and the intermediate output terminal; and
an adjustment step of adjusting a fastening force between the first member and the second member based on a measurement result in the measurement step.

7. The thermoelectric conversion module according to claim 1,
wherein in the plurality of thermoelectric conversion element pairs electrically connected in series, a first thermoelectric conversion element pair and a second thermoelectric conversion element pair are adjacent to each other, the electrode plate, which connect the n-type thermoelectric conversion element in the first thermoelectric conversion element pair to the p-type thermoelectric conversion element in the second thermoelectric conversion element pair, is used as the intermediate output terminal.

8. An insulated circuit substrate comprising:
a thermoelectric conversion element pair in which an n-type thermoelectric conversion element and a p-type thermoelectric conversion element are connected by interposing an electrode plate; and
a thermal conductive insulating layer,
wherein a plurality of thermoelectric conversion element pairs is arranged on one surface of the thermal conductive insulating layer and electrically connected in series,
a first output terminal is provided on the thermoelectric conversion element pair arranged at one end side of the plurality of the thermoelectric conversion element pairs electrically connected in series, and a second output terminal is provided on the thermoelectric conversion element pair arranged at an other end side of the plurality of the thermoelectric conversion element pairs electrically connected in series,
an intermediate output terminal is provided at any position between the thermoelectric conversion element pair arranged at the one end side and the thermoelectric conversion element pair arranged at the other end side, and
thermoelectric conversion element pair rows, which are formed by linearly arranging the plurality of the thermoelectric conversion element pairs along a first direction of the one surface, are aligned in a plurality of rows along a second direction of the one surface and connected in a crank shape to form the intermediate output terminal used as the electrode plate at a connecting portion between the thermoelectric conversion element pair rows adjacent to each other.

* * * * *